United States Patent
Tucker et al.

(10) Patent No.: US 7,517,807 B1
(45) Date of Patent: Apr. 14, 2009

(54) METHODS FOR FABRICATING SEMICONDUCTOR STRUCTURES

(75) Inventors: Jesse Berkley Tucker, Niskayuna, NY (US); Kevin Sean Matocha, Rexford, NY (US); Peter Wilson Waldrab, Schenectady, NY (US); James Howard Schermerhorn, Ballston Spa, NY (US); Matthew Morgan Edmonds, Cilfton Park, NY (US)

(73) Assignee: General Electric Company, Niskayuna, NY (US)

( * ) Notice: Subject to any disclaimer, the term of this patent is extended or adjusted under 35 U.S.C. 154(b) by 168 days.

(21) Appl. No.: 11/493,231

(22) Filed: Jul. 26, 2006

(51) Int. Cl.
*H01L 21/302* (2006.01)
(52) U.S. Cl. .................... 438/739; 438/637
(58) Field of Classification Search ............. 438/140, 438/268, 217, 589, 739, 299, 105; 257/77, 257/330, 331, E29.104, E29.066
See application file for complete search history.

(56) References Cited

U.S. PATENT DOCUMENTS

| | | | |
|---|---|---|---|
| 5,342,797 A * | 8/1994 | Sapp et al. .............. | 438/268 |
| 5,510,281 A | 4/1996 | Ghezzo et al. | |
| 5,731,604 A * | 3/1998 | Kinzer .................... | 257/153 |
| 5,814,859 A | 9/1998 | Ghezzo et al. | |
| 6,204,135 B1 * | 3/2001 | Peters et al. ............. | 438/301 |
| 6,225,680 B1 | 5/2001 | Peters et al. | |
| 6,372,559 B1 | 4/2002 | Crowder et al. | |
| 6,551,865 B2 | 4/2003 | Kumar et al. | |
| 6,709,965 B1 * | 3/2004 | Chen et al. ............... | 438/612 |
| 7,074,643 B2 * | 7/2006 | Ryu ......................... | 438/105 |
| 2003/0122164 A1 | 7/2003 | Komatsu | |
| 2003/0157777 A1 | 8/2003 | Van Zeghbroeck et al. | |
| 2004/0188755 A1 | 9/2004 | Tarui et al. | |
| 2005/0029568 A1 | 2/2005 | Tokuda et al. | |
| 2007/0200179 A1 * | 8/2007 | Chen ....................... | 257/369 |

FOREIGN PATENT DOCUMENTS

JP 2005260267 A * 9/2005

OTHER PUBLICATIONS

Quirk, Michael & Serda, Julian "Semiconductor Manufacturing Technology" Prentice Hall 2001 pp. 443.*
Quirk, Micahel & Serda, Julian "Semiconductor Manufacturing Technology" Prentice Hall 2001 pp. 443 & 445.*
F. J. Baliga, "Device Structures and Technology," Modern Power Devices, Krieger Publishing Company, 1992, pp. 331-336.
J. N. Pan et al., "Self-aligned 6H-SiC MOSFETs with improved current drive," Electronics Letters, Jul. 1995, vol. 31, pp. 1200-1201.

(Continued)

*Primary Examiner*—David Vu
*Assistant Examiner*—Brandon Fox
(74) *Attorney, Agent, or Firm*—Penny A. Clarke

(57) ABSTRACT

A method for fabricating a semiconductor structure includes forming a carbon masking layer on a semiconductor layer, forming a protective layer on the carbon masking layer. The method further includes forming an opening in the protective layer and the carbon masking layer and processing the semiconductor layer through the opening to form a first processed region in the semiconductor layer. The method further includes enlarging the opening in the carbon masking layer and performing an additional processing step on the semiconductor layer through the enlarged opening to form a second processed region in the semiconductor layer.

10 Claims, 14 Drawing Sheets

OTHER PUBLICATIONS

Figure 1:
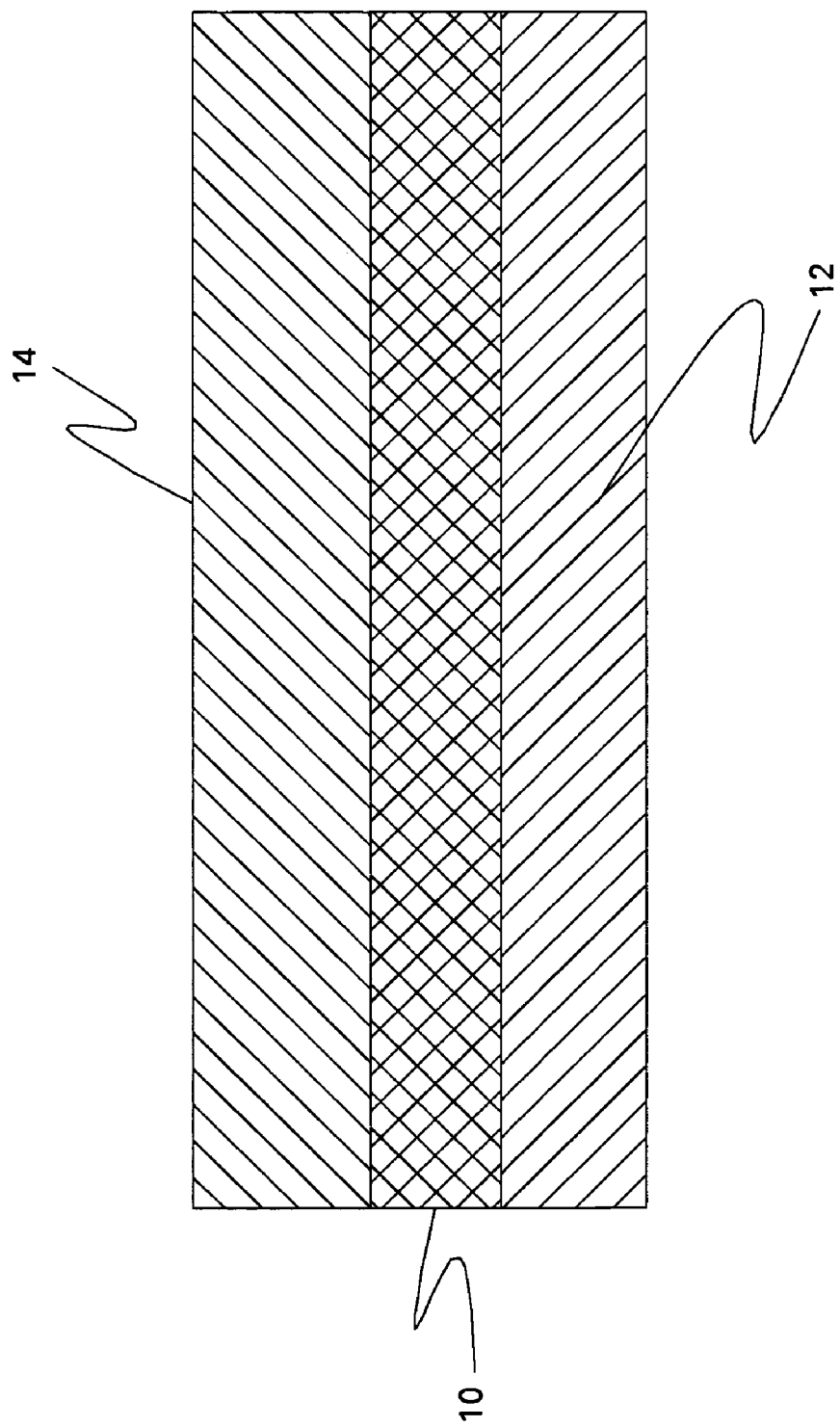

J. W. Palmour et al., 4H-silicon carbide power switching devices, Technical digest of International Conference on SiC and related material, Kyoto, 1995, pp. 813-816.

T. Laska et al., "A low loss/highly rugged IGBT-generation—based on a self aligned process with a double implanted N/N $^+$-emitter," Proc. of the 6$^{th}$ International Symposium on Power Semiconductor Devices & Ic's, Davos, 1994, pp. 171-175.

U.S. Appl. No. 11/400,842, J. Tucker, "Semiconductor Transistors Having Reduced Channel Widths and Methods of Fabricating Same," Filed Apr. 10, 2006, GE Docket No. 193441-1.

Y. Fong et al., "Channel Width Effect on MOSFET Breakdown," IEEE Transaction on Electron Devices, vol. 39, No. 5, May 1992, pp. 1265-1267.

* cited by examiner

METHODS FOR FABRICATING SEMICONDUCTOR STRUCTURES

BACKGROUND

The invention relates generally to semiconductor devices and, more particularly, to semiconductor devices with self-aligned ion implant regions.

Silicon carbide (SiC) is an attractive alternative to silicon for high voltage, high power applications due to SiC's material properties. For example, SiC's wide band gap and high thermal conductivity facilitate elevated temperature operation, and SiC's high electron mobility enables high-speed switching.

For certain devices, such as metal oxide semiconductor field effect transistors (MOSFET), it is desirable to control the channel dimensions. In particular, to achieve a low on-state resistance, it is desirable to reduce the channel width of the device. However, conventional techniques typically employ multiple lithography steps, which introduce overlay misalignments, thereby limiting the resolution of the channel length. For example, for a power MOSFET device, the channel formation typically involves the deposition and patterning of at least two photolithographic layers. For conventional processes, each of the photolithography processes typically incorporates a separate masking layer. Disadvantageously, relying on the alignment of multiple lithography steps to form the channel of a power MOSFET limits the manufacturability of the channel. Specifically, channel dimensions are generally set on the order of 1 micron or greater to account for any misalignments caused by employing multiple lithography processes with multiple masking layers. As a result, SiC MOSFETs are typically designed to have channel lengths sufficiently greater than 1 micron, in order to fall within conventional tolerance limits. These larger channel dimensions disadvantageously increase both the on-state resistance and the power dissipation of the device.

Thus, there is a need to tightly control channel dimensions for SiC MOSFETs. In addition, there is a need to align the gate with the channel. Accordingly, methods for fabricating semiconductor structures are needed to address these issues.

BRIEF DESCRIPTION

Briefly, one aspect of the present invention resides in a method for fabricating a semiconductor structure. The method includes forming a carbon masking layer on a semiconductor layer, forming a protective layer on the carbon masking layer, and forming an opening in the protective layer and the carbon masking layer. The method further includes processing the semiconductor layer through the opening to form a first processed region in the semiconductor layer, enlarging the opening in the carbon masking layer and performing an additional processing step on the semiconductor layer through the enlarged opening to form a second processed region in the semiconductor layer.

DRAWINGS

These and other features, aspects, and advantages of the present invention will become better understood when the following detailed description is read with reference to the accompanying drawings in which like characters represent like parts throughout the drawings, wherein:

FIGS. 1-14 are cross-sectional views illustrating fabrication steps for a double-implanted metal oxide semiconductor field effect transistor (DMOSFET).

DETAILED DESCRIPTION

Figure 2:
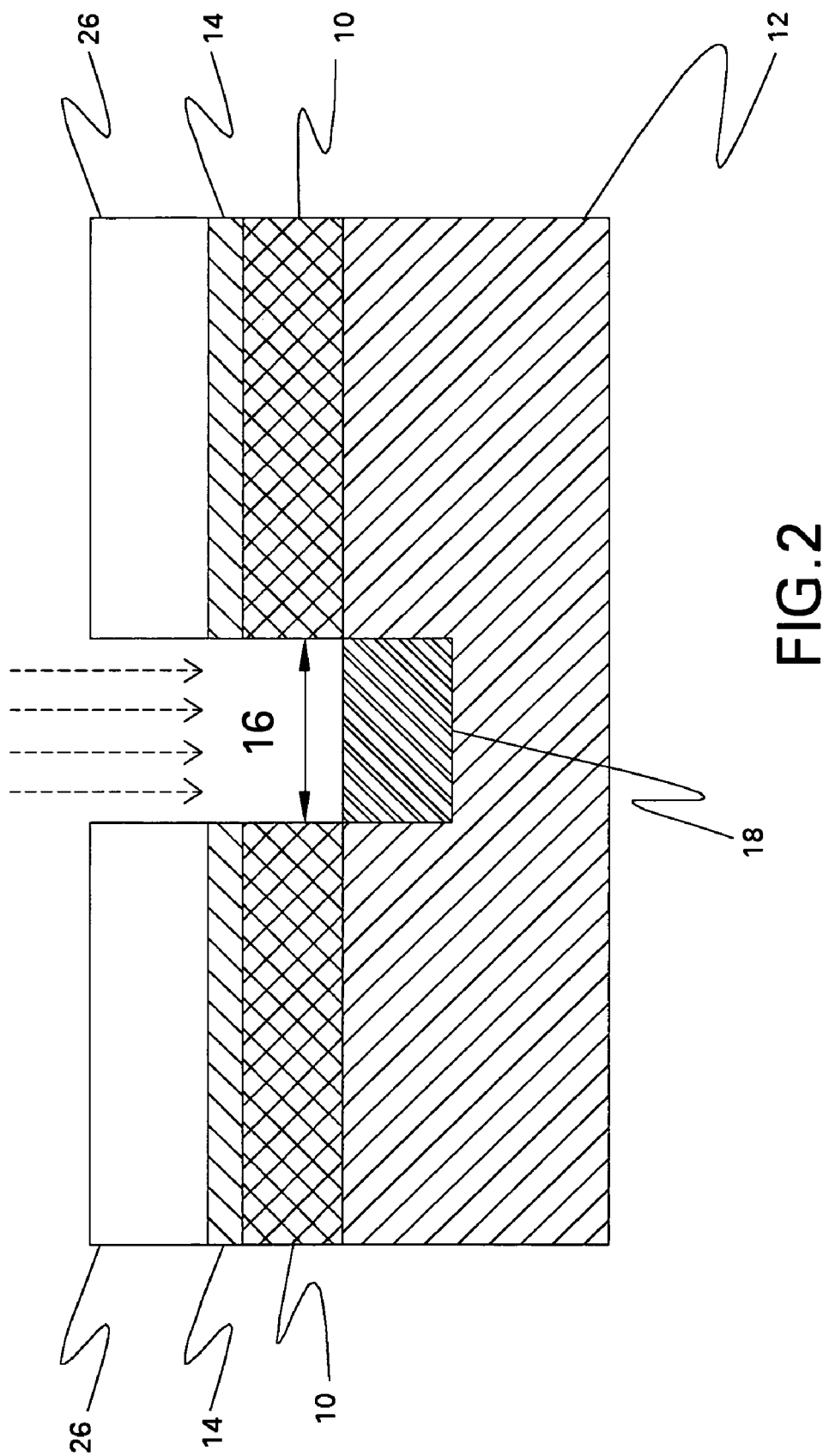
Figure 3:
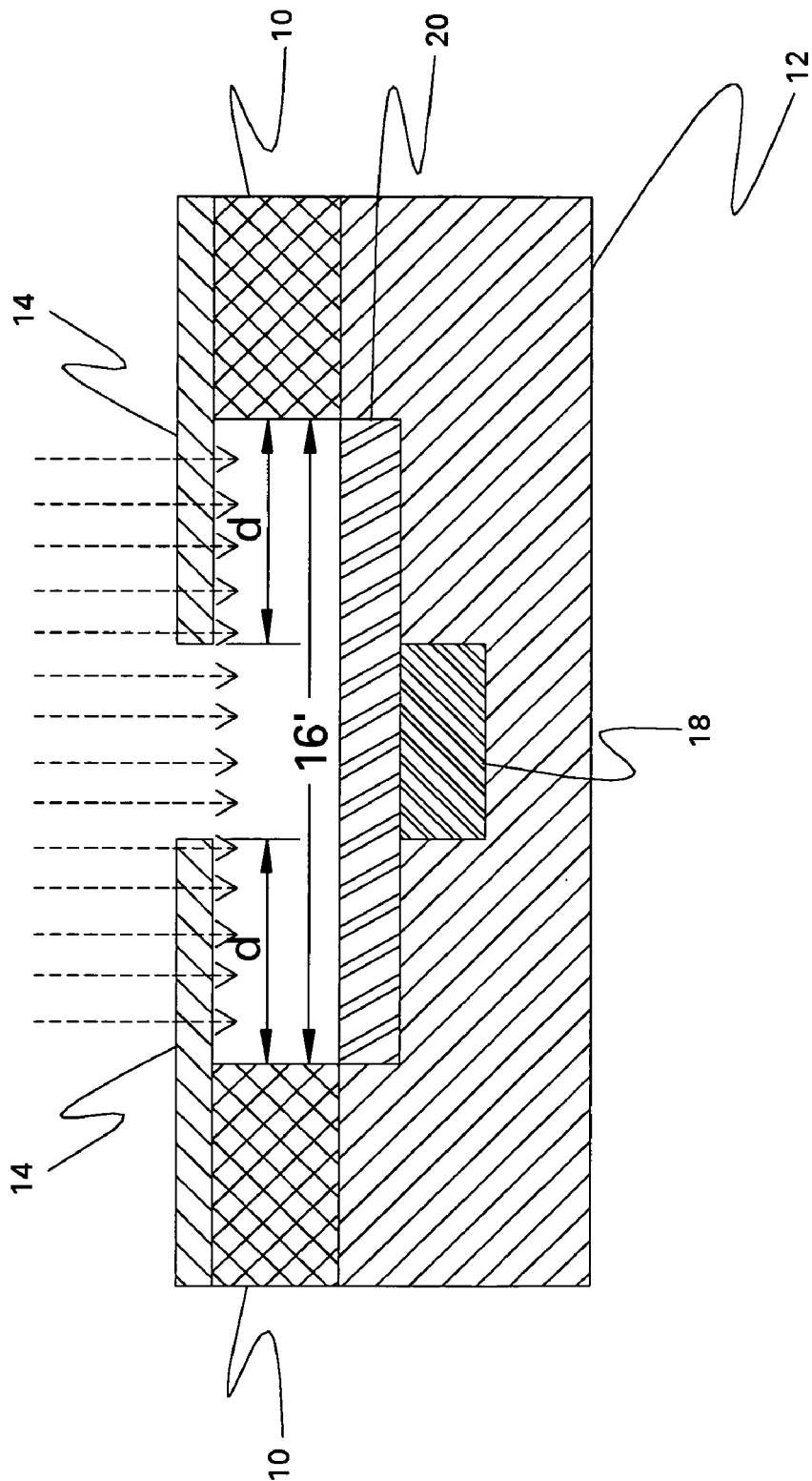

FIGS. 1-13 are cross-sectional views illustrating fabrication steps for a double-implanted metal oxide semiconductor field effect transistor (DMOSFET). As illustrated in FIG. 1, a method embodiment of the invention for fabricating a semiconductor structure includes forming a carbon masking layer 10 on a semiconductor layer 12. A protective layer 14 is formed on the carbon masking layer 10, as indicated in FIG. 1. As illustrated in FIG. 2, the method further includes forming an opening 16 in the protective layer 14 and the carbon masking layer 10, as well as processing the semiconductor layer 12 through the opening 16 in the masking layer 10 to form a first processed region 18 in the semiconductor layer. For example, the opening 16 may be formed using photolithography, as discussed in detail below with reference to FIG. 2. As indicated in FIG. 3, for example, the method further includes enlarging the opening 16 in the carbon masking layer 10 and performing an additional processing step on the semiconductor layer 12 through the enlarged opening 16' in the masking layer 10 to form a second processed region 20 in the semiconductor layer 12.

Those skilled in the art will recognize that the methods disclosed herein are described with reference to the fabrication of a single cell of a semiconductor structure. The claimed methods are intended to encompass the fabrication of semiconductor structures with one or more of such cells.

The semiconductor layer 12 may be a semiconductor substrate or an intermediate layer of a structure fabricated on an underlying substrate. For the illustrated embodiment, the semiconductor layer 12 comprises silicon carbide (SiC). There are a number of SiC polytypes, including, without limitation, 3C, 4H, 6H, 15R, 2H, 8H, 10H, 21R and 27R. In certain non-limiting examples, the semiconductor layer 12 comprises a 4H or 6H SiC polytype. The carbon masking layer 10 is particularly beneficial for use in forming SiC structures, in that graphite can withstand the high temperatures (for example, >1400 C) needed for SiC ion implant anneals. However, the present invention is not limited to SiC, and the semiconductor structure may comprise other wide band gap semiconductors, including but not limited to, Gallium Arsenide (GaAs), Aluminum Nitride (AlN) and Gallium Nitride (GaN). The semiconductor layer 12 may be p-type, n-type or undoped. It will be understood by those skilled in the art that "n-type" and "p-type" refer to the majority charge carriers, which are present in a respective layer. For example, in n-type regions, the majority carriers are electrons, and in p-type regions, the majority carriers are holes (the absence of electrons).

For the illustrated DMOSFET example, the semiconductor layer 12 is a n-type SiC epilayer with a thickness of about 11 microns and an impurity concentration of about $9 \times 10^{15}$ atoms/cm$^3$, where the epilayer is formed on a n+SiC substrate. This example is purely illustrative and does not limit the invention.

Various techniques may be employed to form the carbon masking layer 10. For certain embodiments, an organic layer 10 is deposited on the semiconductor layer 12. The semiconductor layer 12 and organic layer 10 are then heated to graphitize the organic layer 10. By "graphitize" it is meant that the organic layer is subjected to a heating process to remove substantially all but carbon from the layer, making the remaining layer primarily graphitic. Example organic layers include resins, and in one particular example photoresist is deposited (for example, by spinning or spraying) and baked at a temperature of about 700 degrees Celsius in vacuum or in the presence of an inert ambient, such as argon. The bake-out temperature will depend upon the material being graphitized. In this manner, a graphite masking layer is formed. In other embodiments, a diamond like carbon (DLC) layer 10 is deposited using chemical vapor deposition (CVD) techniques. The thickness of the carbon masking layer 10 will depend upon the subsequent processing steps being performed using the mask. For example, for ion implantation, the mask thickness is selected such that the mask is thick enough to mask the ion implants that are being used. According to particular embodiments, the carbon protective layer 10 has a thickness in a range of about 0.5 microns to about 2.0 microns.

The protective layer 14 is formed of a material with good etch selectivity relative to the carbon masking layer 10. Example materials for the protective layer 14 include silicon nitride (including without limitation, stoichiometric $Si_3N_4$ and non-stoichiometric $SiN_x$), silicon dioxide (including without limitation, $SiO_2$ and non-stoichiometric $SiO_x$), aluminum nitride (including without limitation AlN and non-stoichiometric $AlN_x$), indium tin oxide and combinations thereof, nonlimiting examples of which include silicon oxynitride. Depending on the deposition technique, the protective layer 14 may also contain byproducts of the species used to synthesize the material, for example, when forming a silicon nitride layer, Hydrogen may be incorporated. In one illustrated, non-limiting example, the protective layer 14 comprises $Si_3N_4$. Various techniques may be employed to deposit the protective layer 14, and the particular technique will depend upon the material being deposited. For particular embodiments $Si_3N_4$ is deposited using a plasma enhanced CVD (PECVD) process or a low pressure CVD process (LPCVD). The thickness of the protective layer 14 will depend upon the subsequent processing steps being performed. For example, for ion implantation, the $Si_3N_4$ thickness is selected such that the implants can penetrate the $Si_3N_4$. According to particular embodiments, the $Si_3N_4$ layer has a thickness in a range of about 500 Angstroms to about 5000 Angstroms, and more particularly in a range of about 500 Angstroms to about 1000 Angstroms.

Referring next to FIG. 2, the following processing steps may be performed to form opening 16 in the carbon masking layer 10 and the protective layer 12. First, the $Si_3N_4$ layer 14 is coated with photoresist 26. Next, the photoresist 26 is selectively exposed to ultraviolet (UV) radiation, for example using a stepper photolithography tool. The photoresist 26 is then developed, to form a mask as shown for example in FIG. 2. The protective layer 14 is etched using the photoresist 26 as a mask. For the illustrated embodiment, the $Si_3N_4$ protective layer 14 is etched using an anisotropic etch, such as a reactive ion etch (RIE), for example using $CHF_3$ plus Argon to remove the nitride as shown and to slightly etch the graphite 10. Next the graphite layer 10 is etched to form the opening 16. According to a particular embodiment, an anisotropic etch is performed to remove the graphite. For the illustrated embodiment, the graphite 10 is etched using a RIE plasma, for example oxygen, which is anisotropic and selective to both graphite and $Si_3N_4$. The photoresist layer 26 may be removed, for example using an acetone bath. As noted above, the semiconductor layer 12 is then processed through the opening 16 to form a first processed region 18 in the semiconductor layer 12. For the illustrated embodiment, an ion implantation (indicated by the vertical arrows) step is performed to form a p+ region 18, as indicated in FIG. 2.

For particular embodiments, an isotropic, dry etching process is then performed to undercut the carbon masking layer 10, as indicated in FIG. 3. For the illustrated example, the graphite layer 10 is isotropically etched in a barrel asher or using an inductively coupled plasma (ICP) etch system with an oxygen plasma. Beneficially, the isotropic etching process selectively etches the carbon masking layer and preserves both the $Si_3N_4$ layer and the semiconductor layer 12. The depth of the undercut is indicated by "d" in FIG. 3. The depth d will depend upon the desired size of the region 20 being processed. For the illustrated example, an ion implantation step is performed to form the n+ region 20, as indicated in FIG. 3. For particular embodiments, the depth d of the undercut is in a range of about 0.5-10 microns. In one example, the depth d of the undercut is about 4 microns. Control of this etch governs the ability to place the edge 21 of the n+ implant, which is also the edge of the channel. Advantageously, a dry etch provides a controlled technique for undercutting the carbon masking layer 10, as compared to the wet etching techniques used to remove the silicon dioxide ($SiO_2$) masks in U.S. Pat. No. 6,204,151, Peters et al. One shortcoming of the use of a wet etch to undercut a $SiO_2$ masking layer is the resultant distortion of the sidewall profile to a concave shape. Another shortcoming resides in the difficulty of introducing a wet etchant into a hole without bubbles being trapped. This trapping of bubbles prevents a uniform etching, resulting in poor final device yield.

Figure 4:
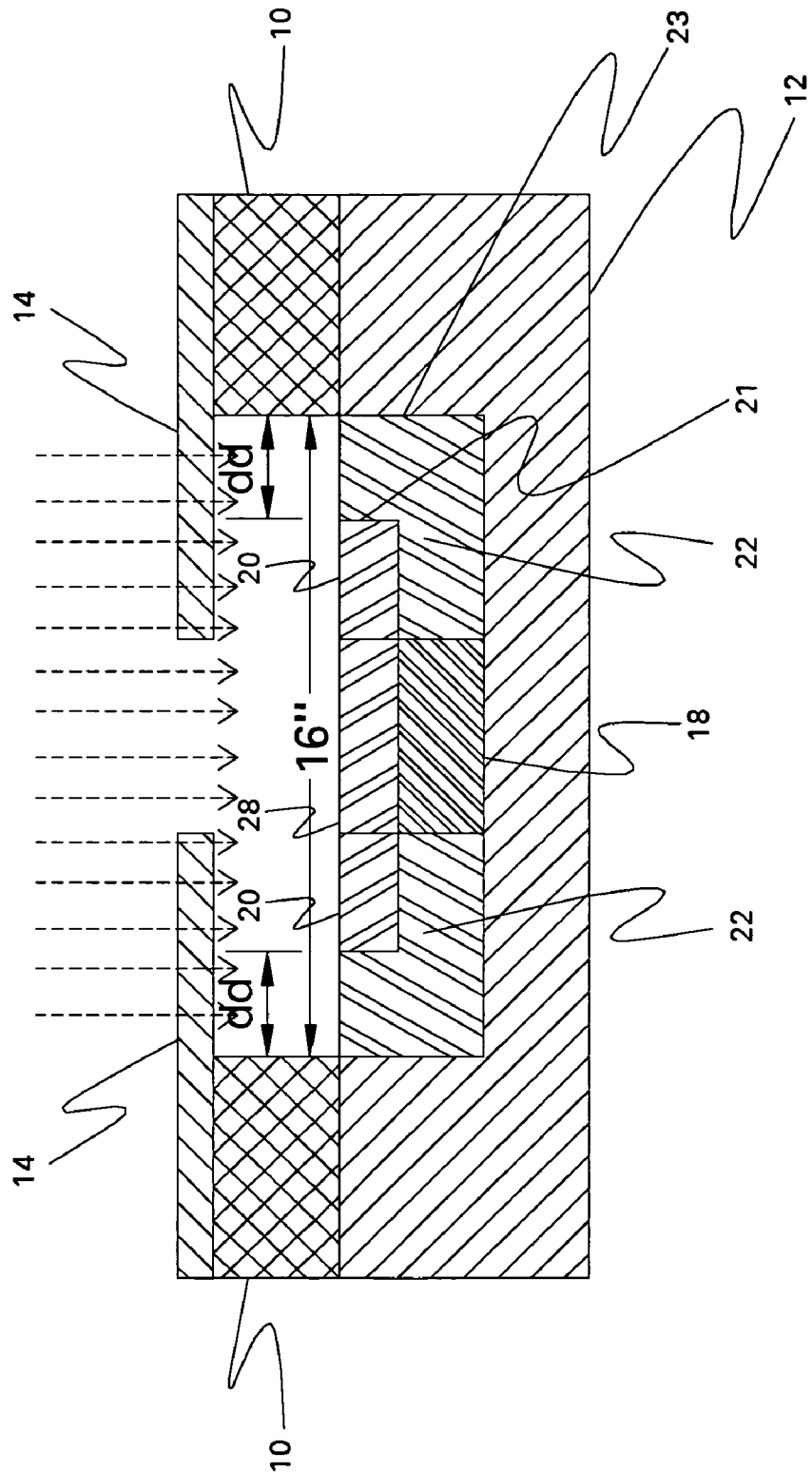

FIG. 4 illustrates additional processing steps. For the illustrated embodiments, the method includes further enlarging the opening in the carbon masking layer 10. An additional processing step is then performed on the semiconductor layer 12 through the enlarged opening 16" to form at least one additional processed region 22 in the semiconductor layer 12. For particular embodiments, an isotropic, dry etching process is performed to undercut the carbon masking layer 12. For the illustrated example, the graphite layer 10 is isotropically etched in a barrel asher or using an inductively coupled plasma etch system with an oxygen plasma to further undercut the graphite 10. For the SiC MOSFET example, this undercut defines the channel length dd, which is defined in the final device structure by the edge 21 of the n+ implant 20 and the edge 23 of the subsequent p– well implant 22. The depth dd will depend upon the desired size of the region 22 being processed. The use of a dry etch provides greater control of the channel length than would be achieved using a wet etch process or using two lithography steps. For the illustrated example, an ion implantation step is performed to form the p– region 22, as indicated in FIG. 4. For particular embodiments, the depth dd of the undercut is in a range of about 0.1 to about 1.5 microns.

For the illustrated embodiments, the processing steps comprise ion implantation (indicated by the vertical arrows in FIGS. 2-4), such that the first processed region 18 comprises a first ion implant region 18, the second processed region 20 comprises a second ion implant region 20, and the additional processed region 22 comprises an additional implant region 22. More particularly, the illustrated example is directed to a DMOSFET, and the first region is a p+ region 18, the second region is a n+ region 20 and the additional implant region is a p– well 22, as indicated in FIGS. 2-4, for example. To form the p+ region 18, a variety of p-type dopants (acceptors) may be implanted, including but not limited to, aluminum, boron, gallium, as well as aluminum carbon co-implants. According to a particular example, the dopant species is Aluminum, and Carbon is coimplanted with the same depth profile as the Aluminum. Typically, the p+ ion implantation is performed at energies in a range of about 5-400 keV, with successive implants at progressively lower energies. The implant may be performed at a temperature in a range of about 25-1000 degrees Celsius, and for a particular example at a temperature of about 1000 degrees Celsius. For the illustrated example, the depth of the p+ implant is in a range of about 0.25-1.5 microns and for a particular example is about 0.7 microns. Example widths for the p+ region are in a range of about 2-10 microns.

To form the n+ region 20, a variety of n-type dopants (donors) may be implanted, including but not limited to, nitrogen, phosphorous, arsenic, antimony and combinations thereof. The donors are implanted through the relatively thin protective layer 14 at a temperature in a range of about 25-1000 degrees Celsius. According to a particular example, the n+ implant is performed at about 600 degrees Celsius. For the illustrated example, the n+ region is formed using a shallow n+ implant at a depth in an example range of about 0.1-1 microns. For one example, the depth of the n+ implant is about 0.25 microns. Typically, the n+ ion implantation is performed at energies in a range of about 5-200 keV, and more particularly in a range of about 15-200 keV, with successive single energy implants.

To form the p− well 22, a variety of p-type dopants (acceptors) may be implanted, including but not limited to, aluminum, boron, magnesium, carbon, calcium and combinations thereof. The implants are typically performed at elevated temperatures, for example in a range of about 25-1000 degrees Celsius, and for certain examples at about 1000 degrees Celsius. Typically, the p− ion implantation is performed at energies in a range of about 5-400 keV, with successive single energy implants. For the illustrated example, the depth of the p− well 22 is in a range of about 0.1-2 microns and for certain examples is about 0.7 microns. Example channel lengths dd are in a range of about 0.1-1.5 microns. Beneficially, because the channel length dd is defined using a dry etch process, the channel length dd can be carefully controlled.

Figure 5:
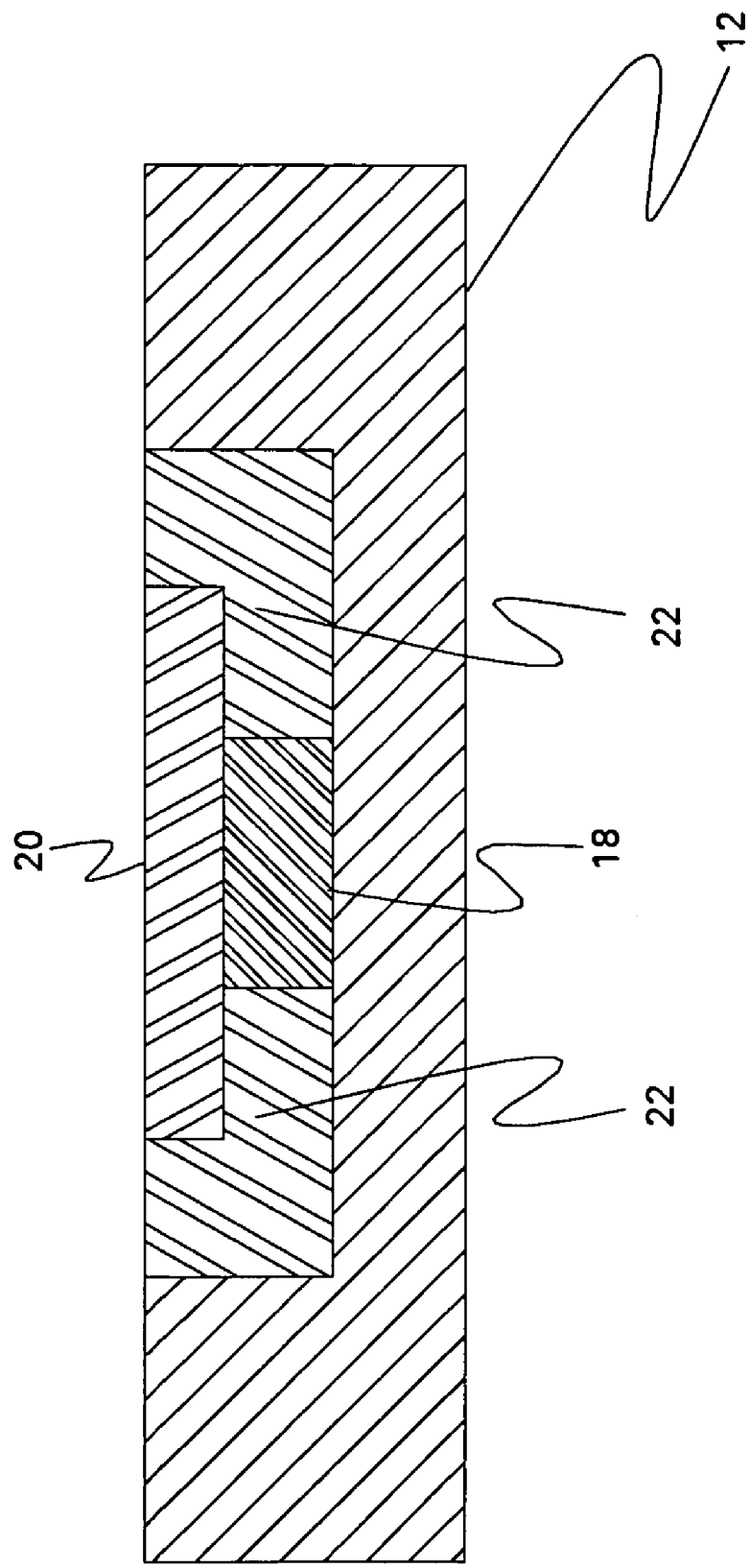

For certain embodiments, the masking layers are removed to yield the structure shown in FIG. 5. For the illustrated embodiment, the $Si_3N_4$ layer 14 is etched away, for example using one of a RIE plasma etch or a chemical wet etch of phosphoric acid or buffered hydrofluoric acid (BHF). More generally, the mask removal technique is chosen such that it is selective to the semiconductor 12 and implanted regions. In one example, the $Si_3N_4$ layer is wet etched in BHF. Next, the graphite layer 10 is etched away, for example using a barrel Oxygen asher, an ICP Oxygen plasma etch, a RIE Oxygen plasma etch or by thermal oxidation. At this point, the channel has been formed and a variety of devices could be realized using the self-aligned channel, including but not limited to, SiC DMOSFET, bipolar transistors and IGBTs.

Figure 6:
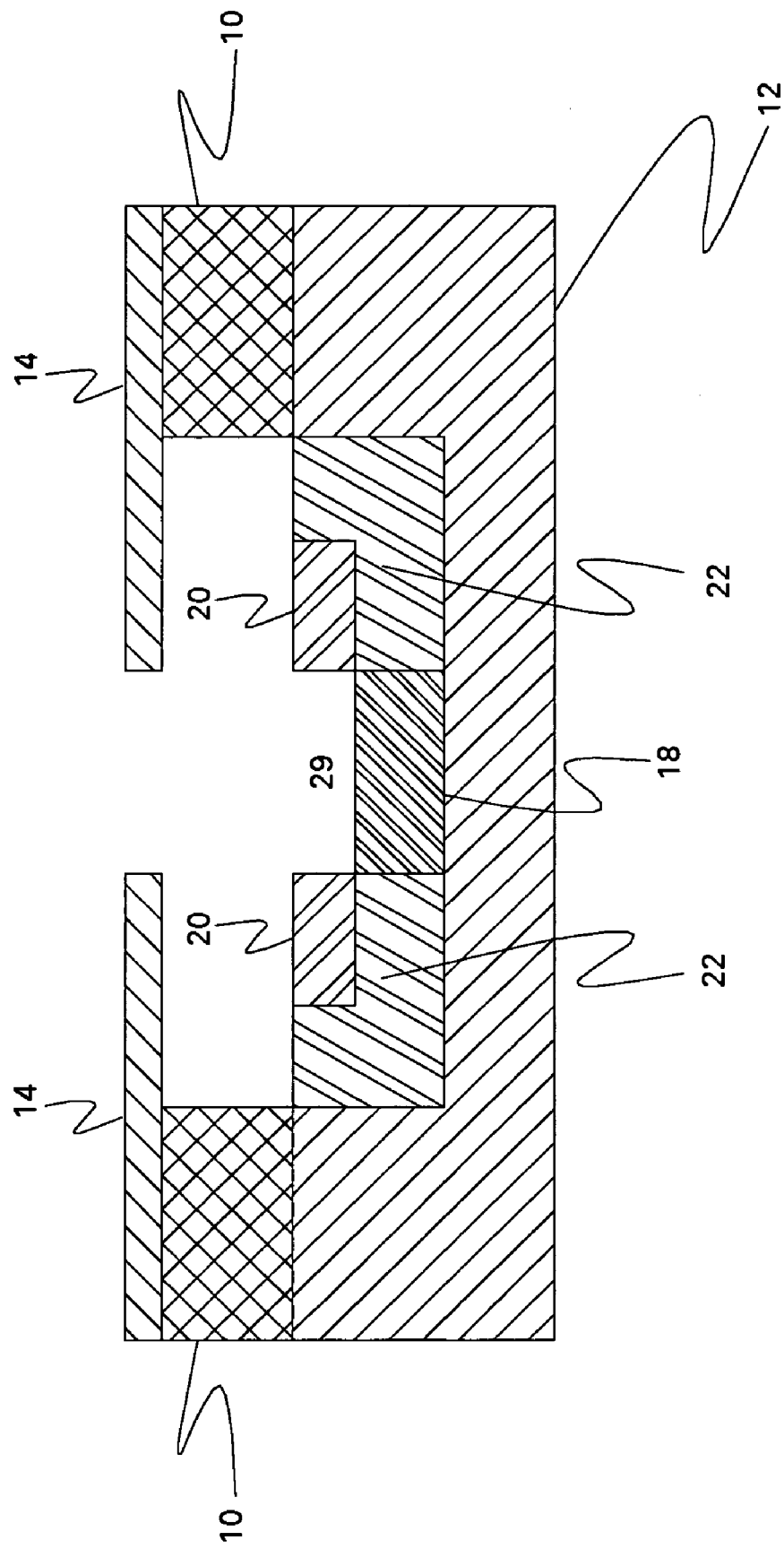

FIG. 6 illustrates an optional dimple/alignment mark etch process. For the illustrated embodiment, the method further includes performing a dry etch to remove a central portion 28 of the second processed region 20. The central portion 28 is indicated in FIG. 4 and has been removed in FIG. 6. According to particular embodiments, the dry etch comprises an anisotropic dry etch, and the removal of the central portion defines a dimple 29 in the semiconductor layer 12. For the illustrated example, about 0.3 microns of the SiC is removed by performing an RIE or ICP etch using the $Si_3N_4$ layer 14 as an etch mask. The depth of the etch is slightly larger than the depth of the n+ implant, which for the illustrated example is in a range of 0.1-1 microns, and is equal to 0.5 microns in a particular example. By performing this dimple etch prior to removal of the masking layers 10, 14, the dimple 29 serves as a registration mark for subsequent layers, facilitating alignment of the gate metal (not shown) to the channel region. In addition, the dimple 29 improves the ohmic contact to the p+ region 18 (it improves the short of parasitic bipolar junction transistor (BJT) within the DMOSFET). In another example, about 0.3 microns of the SiC is removed by performing an RIE or ICP etch using an additional photolithographically defined etch mask (not shown).

Figure 7:
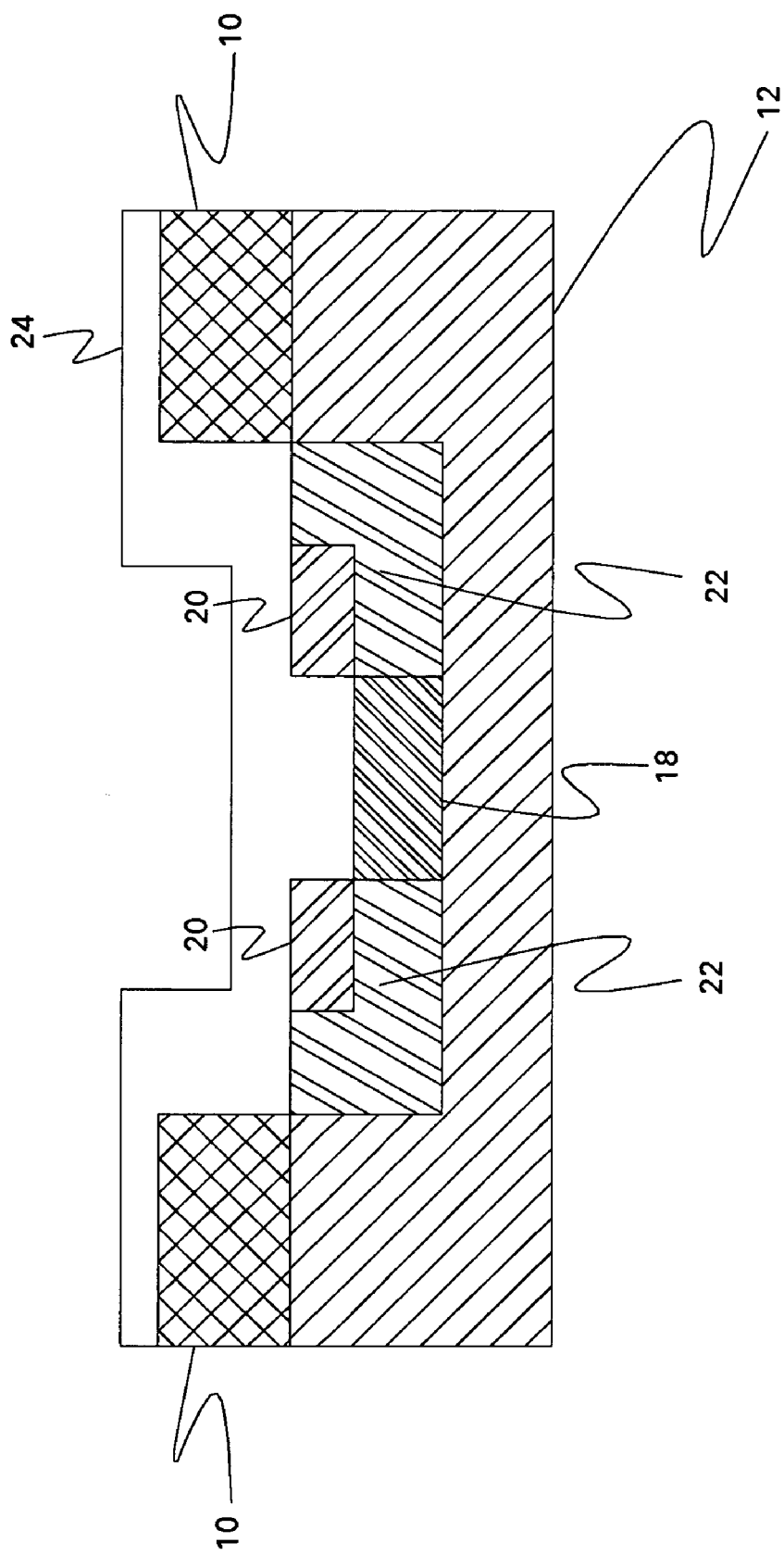

FIG. 7 illustrates an optional technique for forming a self-aligned gate. For the illustrated embodiment, the method further includes removing the protective layer 14, forming a carbon capping layer 24 on the semiconductor layer 12 in the enlarged opening and annealing the semiconductor structure. In one example, the protective layer 14 comprises $Si_3N_4$, and a dry RIE etch is performed to remove the nitride layer 14. The particular etch will depend on the composition of the protective layer 14 and is chosen to be selective relative to graphite.

Various techniques may be employed to form the carbon capping layer 24. For certain embodiments, an organic layer 24 is deposited on the remaining portions of carbon masking layer 10 and on the active region of semiconductor layer 12. The structure is then heated to graphitize the organic layer 24. As noted above, example organic layers include resins, and in one particular example photoresist is deposited (for example, by spinning or spraying) and baked at a temperature of about 700 degrees Celsius. The bake-out temperature will depend upon the material being graphitized. In this manner, a graphite capping layer 24 is formed. In other embodiments, a diamond like carbon (DLC) layer 24 is deposited using chemical vapor deposition (CVD) techniques. The thickness of the carbon capping layer 24 is selected based on the desired spacer thickness. In particular, the thickness of the carbon capping layer 24 sets the lateral spacing from the edges of the first carbon layer 10 to the second graphite layer 32, such that the carbon capping layer 24 covers the channel. For example, the thickness of the carbon capping layer 24 is selected to be slightly larger than the channel length. The channel length is defined as the distance between the edges 21 and 23, which are shown in FIG. 4.

The anneal is performed to activate the implants. In one example, the annealing step comprises heating the semiconductor structure to a temperature of at least about 1600 degrees Celsius. Beneficially, the carbon capping layer 24 provides a protective surface for this high temperature anneal. This is in contrast to the $SiO_2$ thin film system employed in U.S. Pat. No. 6,204,151, Peters et al., which must be removed prior to a high temperature anneal.

Figure 8:
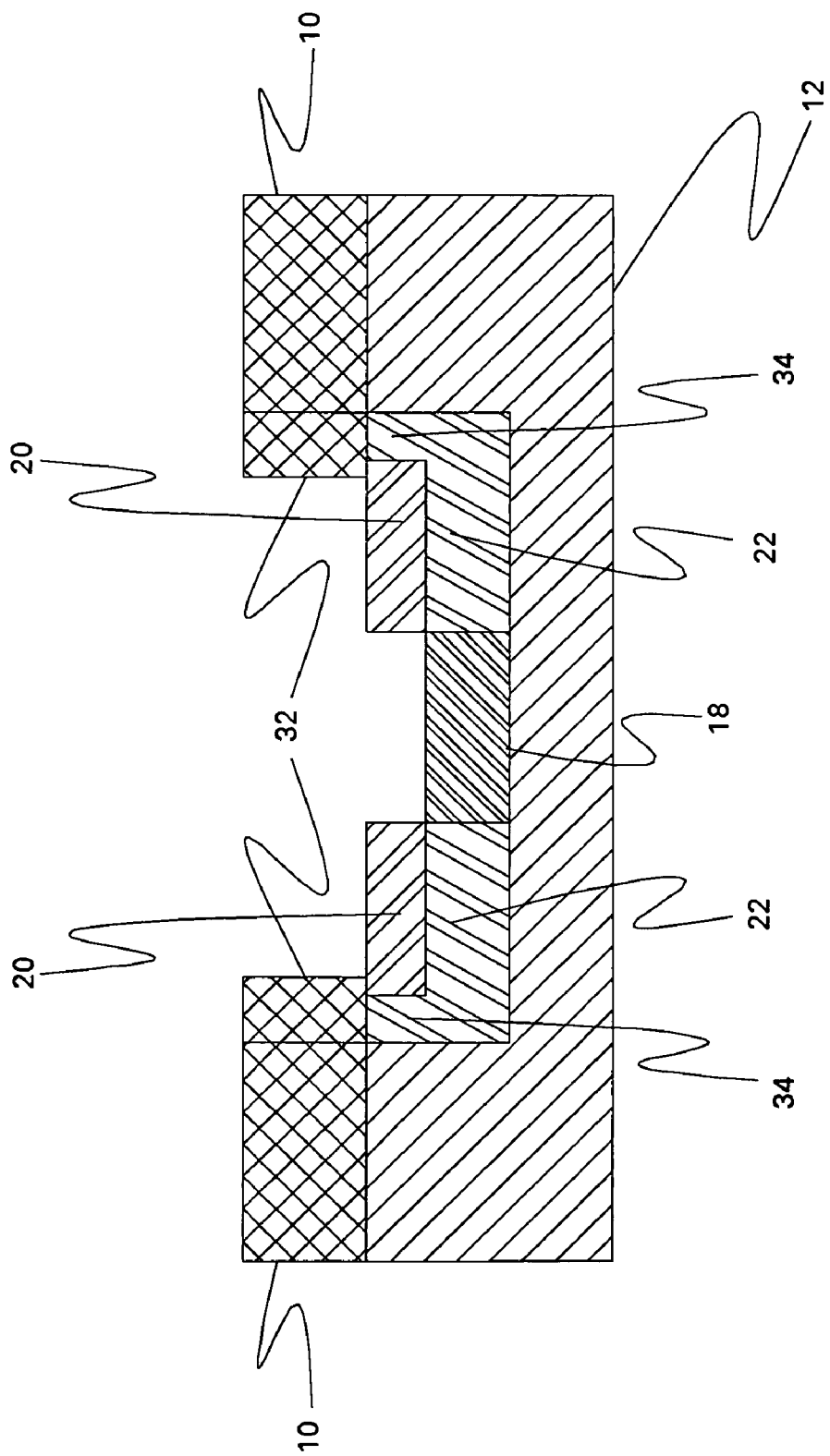

FIG. 8 is a cross-sectional view of a cell and illustrates an optional process for forming a graphite spacer 32. For the illustrated embodiment, the method further includes etching the carbon capping layer 24, where the etch leaves a spacer 32 extending over a channel 34 formed in the additional processed region 22. As indicated in FIG. 8, the channel 34 extends between edges 21 and 23. For the illustrated example, a RIE etch is performed to remove about one micron of the graphite layer 24. The RIE etch leaves the original carbon masking layer 10 plus graphite spacer 32. For the illustrated embodiment, the width of the carbon spacer 32 is about one micron. As indicated in FIG. 8, the spacer 32 covers the device channel 34. The dimensions of the graphite spacer are governed by selection of the thickness of the previous graphite deposition, which is discussed above with reference to FIG. 7.

Figure 9:
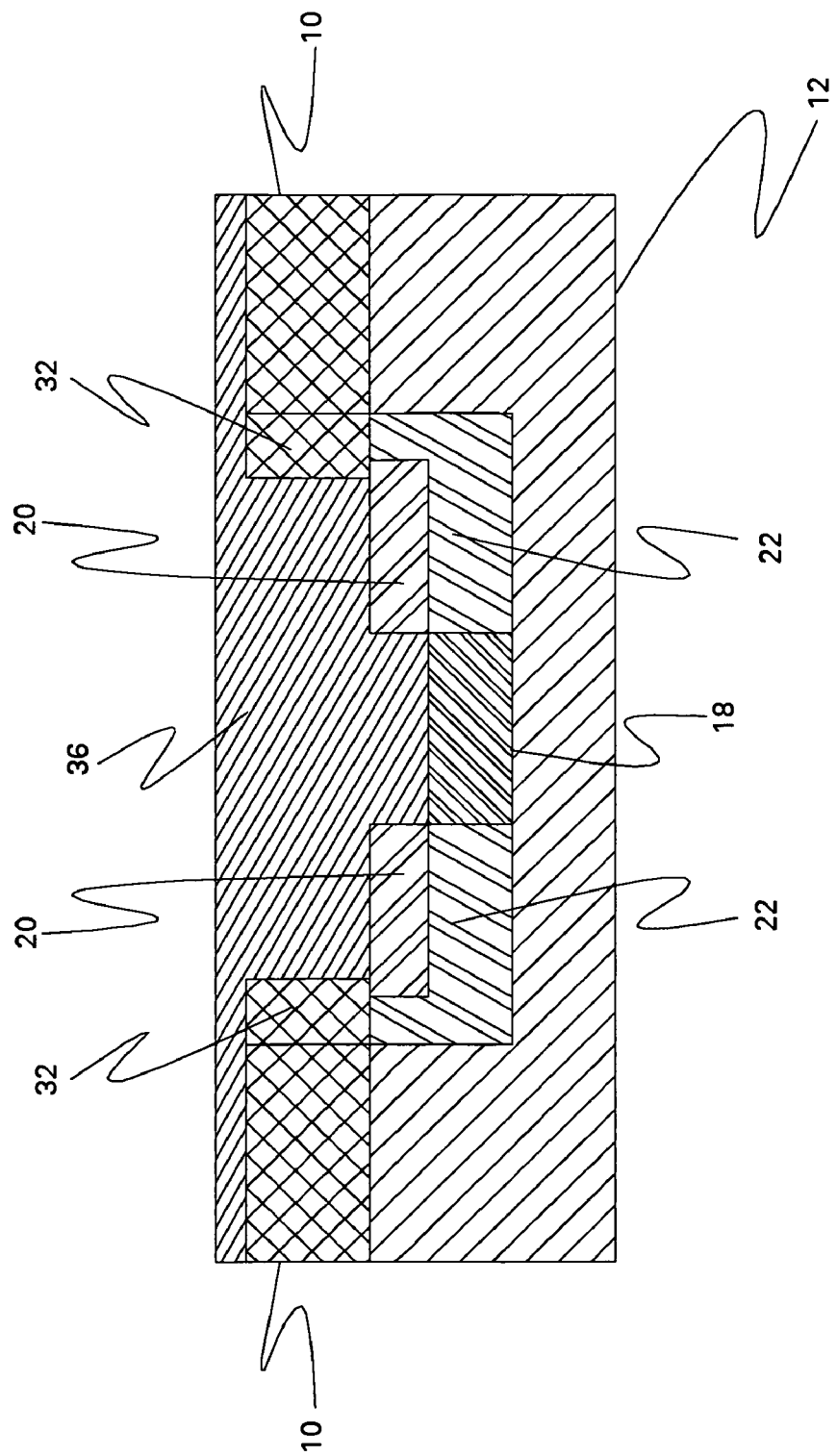
Figure 10:
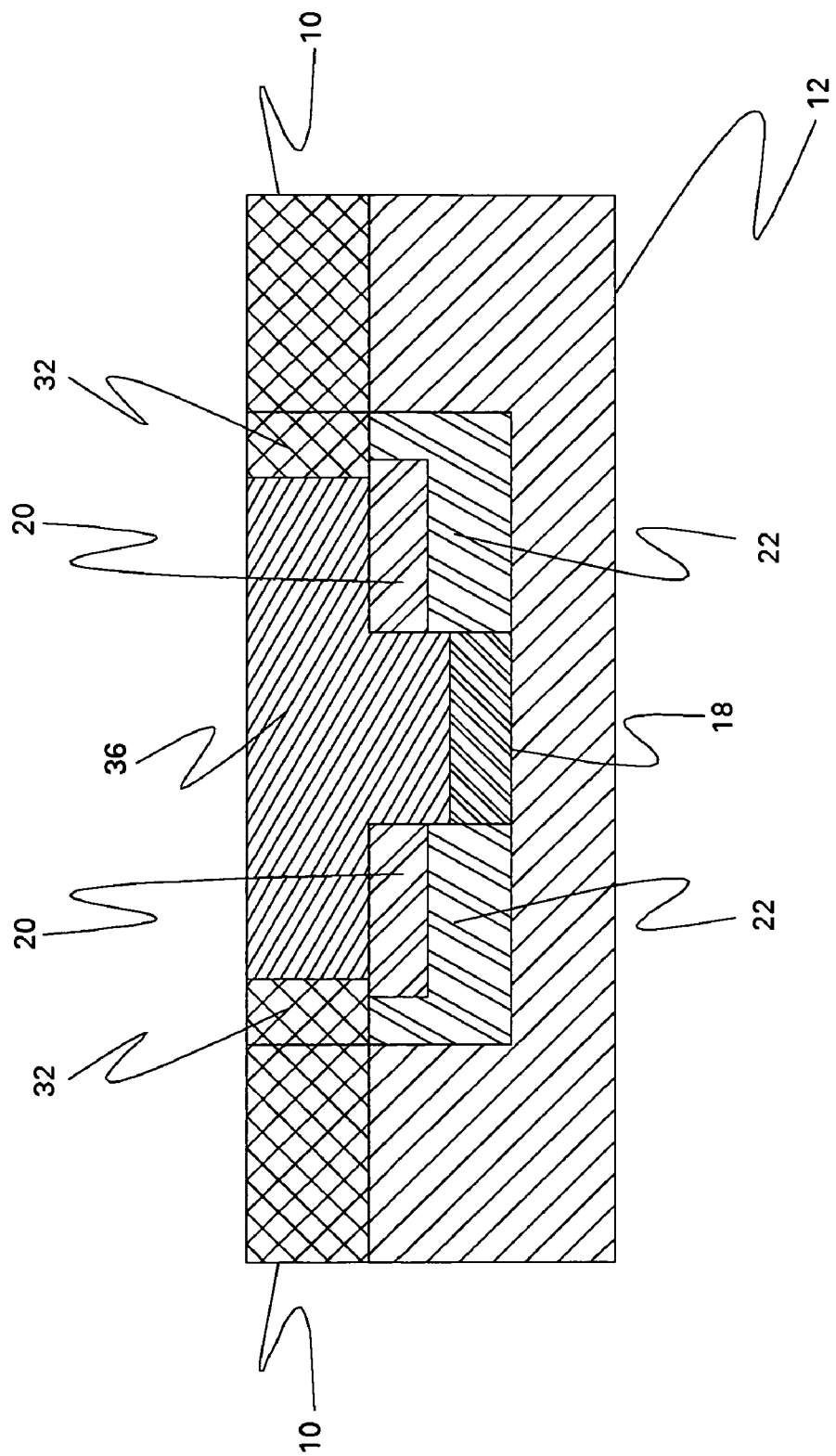

FIGS. 9 and 10 illustrate an optional field oxide image reversal process. For the illustrated embodiment, the method further includes depositing a field oxide layer 36 on the semiconductor structure. In one example, a field oxide layer having a thickness in a range of about 0.5-2 microns is deposited using a conformal deposition technique. Example field oxide materials include, without limitation, $SiO_2$. More particularly, a one micron thick field oxide layer is deposited by LPCVD oxide deposition. Beneficially, the field oxide prevents significant overlap of the subsequent gate metal over the N+ region 20. In this manner, parasitic capacitance of the resulting device is reduced, thereby reducing the overall switching losses of the device. The illustrated embodiment further includes planarizing the field oxide layer. As indicated in FIG. 10, the field oxide extending above the graphite 10, 32 is removed. Various techniques may be employed to planarize the field oxide layer. For example, the planarization may be performed by polishing, chemical mechanical polishing (CMP), or by a planarizing photoresist/wet oxide etch process.

Figure 11:
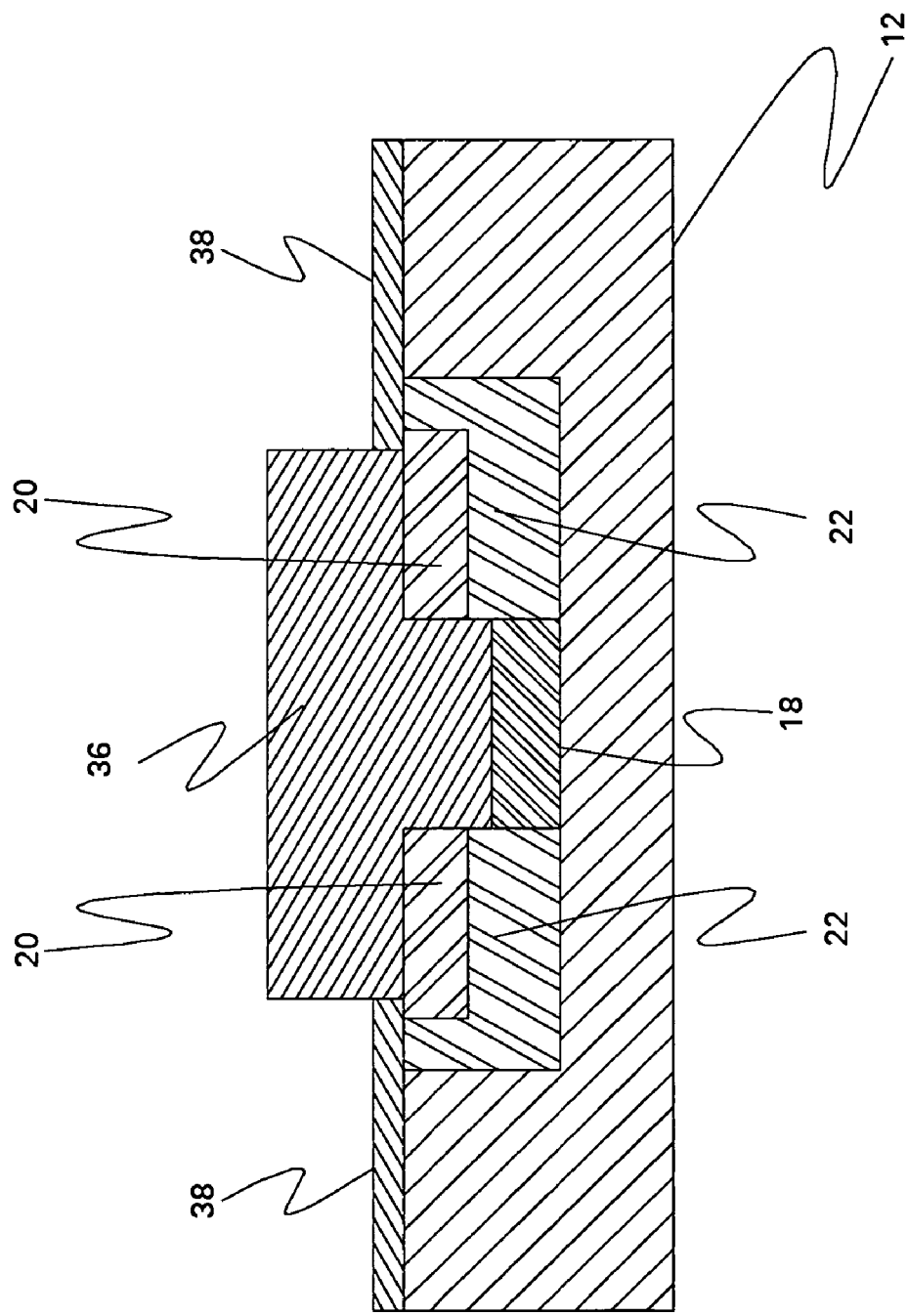

FIG. 11 illustrates additional optional processes. For the illustrated embodiment, the method further includes removing the carbon masking layer 10 and the spacer 32. Various techniques may be employed to remove the graphite layers 10, 32, including without limitation using a barrel oxygen asher, an ICP oxygen plasma etch and thermal oxidation. Next, a gate dielectric layer 38 is formed on the semiconductor structure, as indicated in FIG. 11. Example gate dielectric materials include, without limitation, oxides, such as $SiO_2$. In one example, the gate dielectric is grown by thermal oxidation to form an oxide layer with a thickness in a range of about 100-2000 Angstroms, and more particularly is about 500 Angstroms thick.

Figure 12:
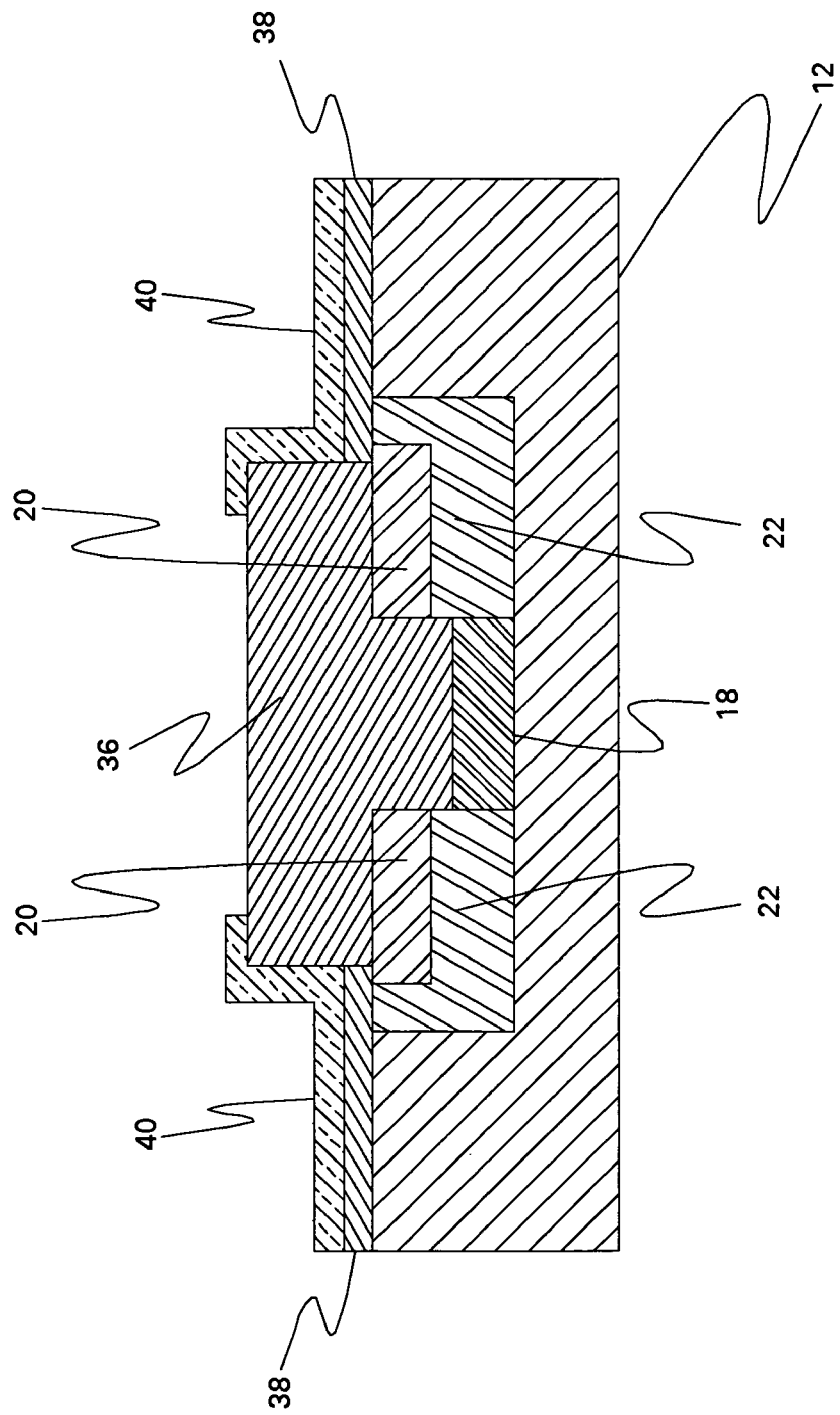

To finish the fabrication of the desired semiconductor device, various metal deposition and patterning processes are performed. For the illustrated DMOSFET example, a gate contact layer 40 is deposited and patterned, as illustrated for example in FIG. 12. A variety of materials can be used as the gate contact, non-limiting examples of which include Molybdenum and heavily doped polysilicon, for example doped with phosphorous or nitrogen to above $1 \times 10^{18}$ $cm^{-3}$. For one non-limiting example, a 6000 Angstrom Molybdenum layer is formed by sputtering. Next, layer 40 undergoes various lithographic processes, as known to those skilled in the art, to form the gate contact regions. The gate contact layer 40 is then etched, for example using RIE, to expose the field oxide 36, as indicated in FIG. 12.

Figure 13:
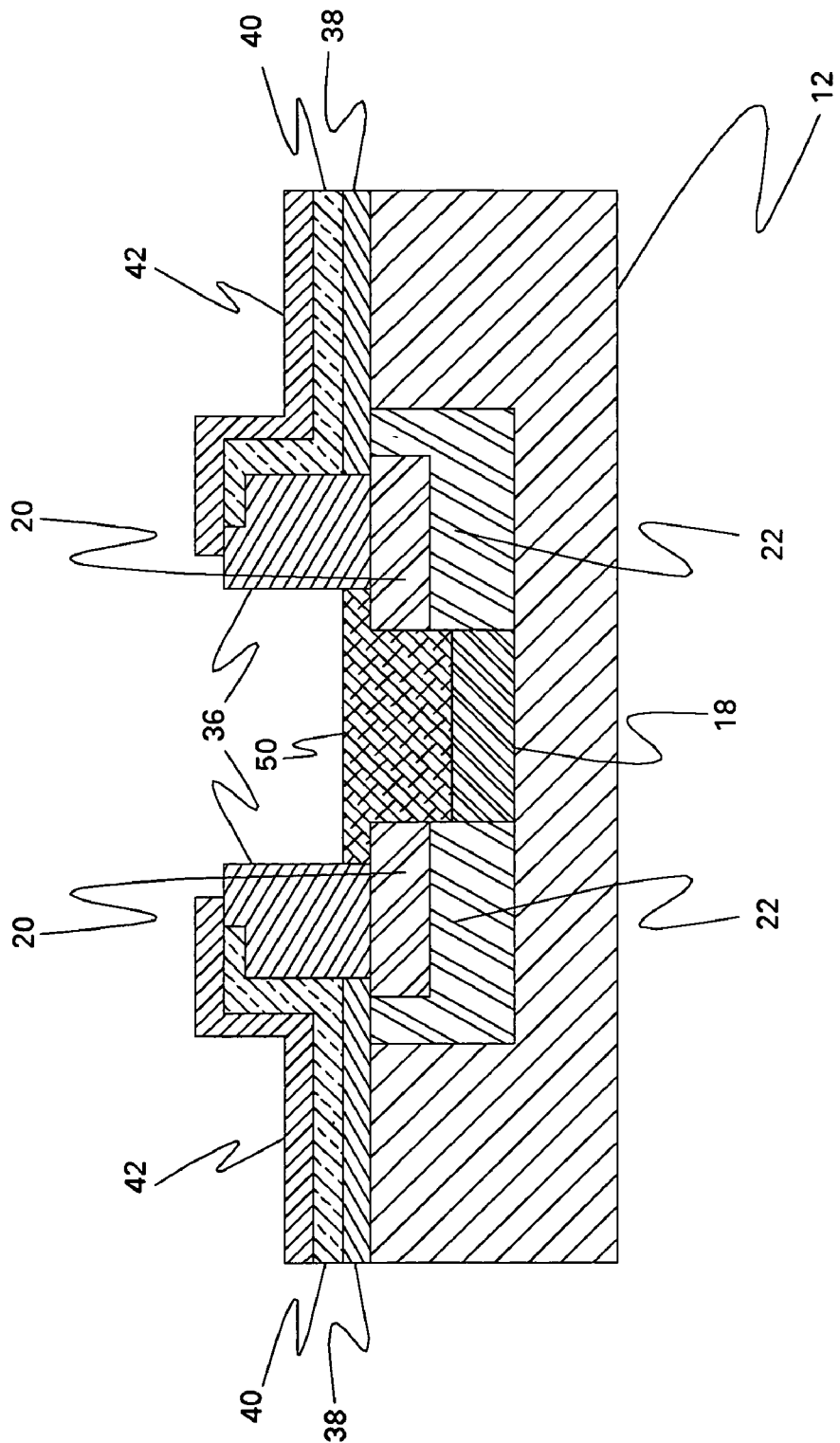

For the illustrated process, ohmic metal patterning processes are then performed. For the illustrated example, a dielectric layer 42 is deposited, as indicated in FIG. 13. For certain embodiments, dielectric layer 42 has a thickness in a range of about 3000 Angstroms to about one micron. For the illustrated example, the dielectric layer 42 is 6000 Angstroms thick. Nonlimiting examples of materials for dielectric layer 42 include phosphosilicate glass/low temperature oxide (PSG/LTO), LPCVD oxide, nitride and boro-phosphosilicate glass (BPSG). Next, dielectric layer 42 is patterned to define regions where the ohmic metal will remain. The field oxide 36 is etched, for example by RIE, down to the silicon carbide. Next, an isotropic etch, for example a wet etch, is performed to undercut the field oxide 36 to provide the desired liftoff edge profile. The ohmic contact metal 50 is deposited and portions thereof are lifted off as shown in FIG. 13. In one example, the lift off comprises soaking in acetone. Nonlimiting examples of the ohmic contact metals include nickel, aluminum, chrome, titanium or combinations thereof. Then, the contacts are annealed.

Figure 14:
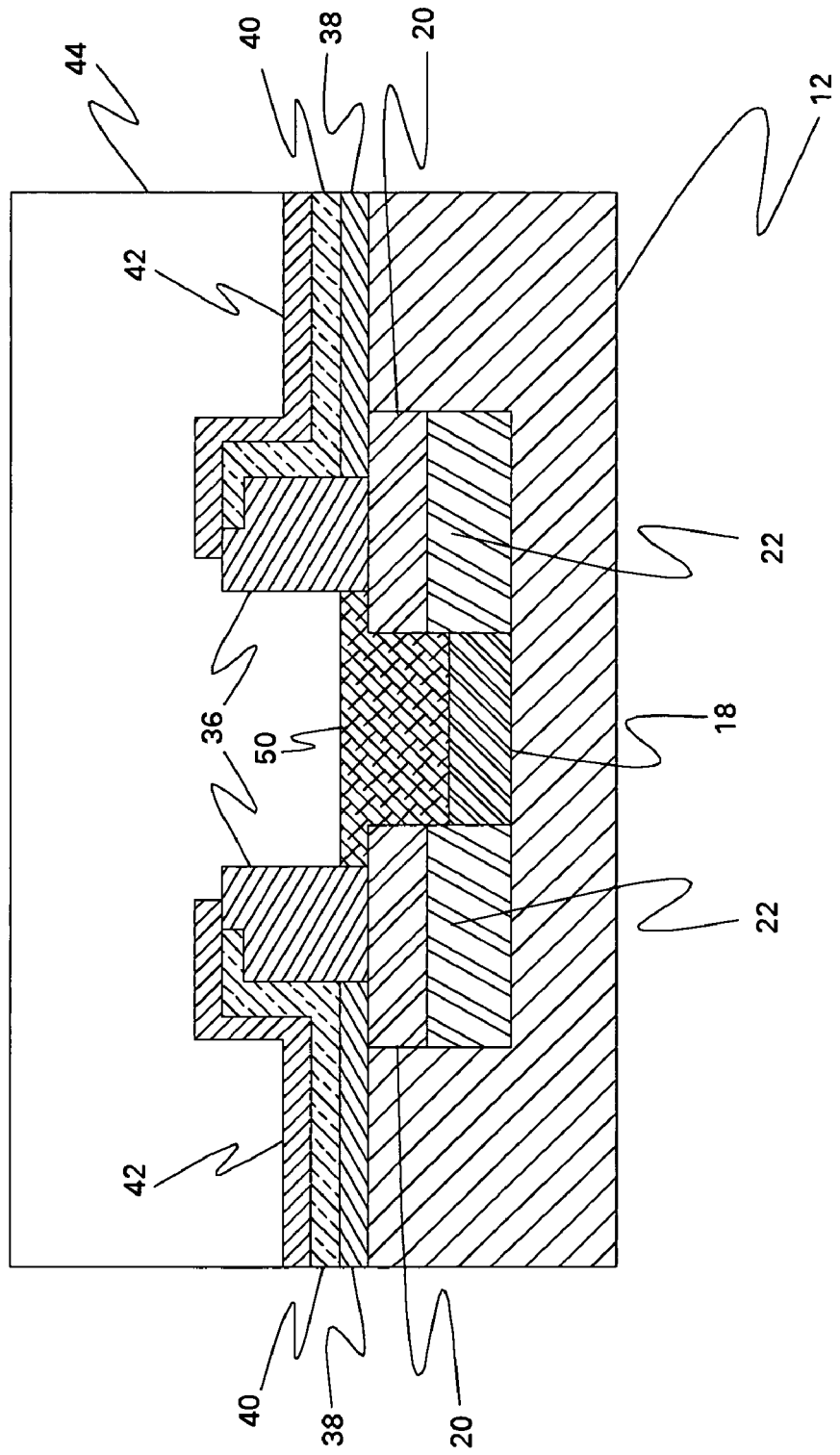

FIG. 14 illustrates additional optional metal patterning steps. For the illustrated example, about 4 microns of Aluminum 44 are deposited, patterned and wet etched to form a contact 44 to the ohmic layer 50.

Beneficially, the present invention simplifies the fabrication process for power MOSFETs by eliminating the need for a second, tightly aligned photolithography level. In addition, the present invention enables tighter control of the alignment of the n-type and p-type implantations. In this manner, the invention provides a repeatable, controllable means for achieving reduced channel dimensions for power MOSFETs.

Although only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for fabricating a semiconductor structure, the method comprising:
   forming a carbon masking layer on a semiconductor layer;
   forming a protective layer on the carbon masking layer;
   forming an opening in the protective layer and the carbon masking layer;
   processing the semiconductor layer through the opening to form a first processed region in the semiconductor layer;
   enlarging the opening in the carbon masking layer;
   performing an additional processing step on the semiconductor layer through the enlarged opening to form a second processed region in the semiconductor layer;
   performing an additional process to further enlarge the opening in the carbon masking layer;
   performing an additional processing step on the semiconductor layer through the further enlarged opening to form at least one additional processed region in the semiconductor layer;
   removing the protective layer;
   forming a carbon capping layer on the semiconductor layer in the enlarged opening;
   annealing the semiconductor structure;
   etching the carbon capping layer, wherein the etching leaves a spacer extending over a channel formed in the additional processed region;
   depositing a field oxide layer on the semiconductor structure;
   planarizing the field oxide layer;
   removing the carbon masking layer and the spacer; and
   forming a gate dielectric layer on the semiconductor structure.

2. The method of claim 1, wherein the processing steps comprise ion implantation, wherein the first processed region comprises a first ion implant region, wherein the second processed region comprises a second ion implant region, and wherein the additional processed region comprises an additional implant region.

3. The method of claim 1, wherein the first implant region comprises a P+ region, wherein the second implant region comprises a N+ region, and wherein the additional implant region comprises a P− region.

4. The method of claim 1, wherein the step of further enlarging the opening comprises performing an isotropic dry etching process.

5. The method of claim 4 wherein the isotropic, etching processes selectively etch the carbon masking layer and preserve the protective layer and the semiconductor layer.

6. The method of claim 1, wherein the step of forming the carbon capping layer comprises depositing an organic layer and heating the organic layer to form a graphite layer.

7. The method of claim 1, wherein the annealing step comprises heating the semiconductor structure to a temperature of at least about 1600 degrees Celsius.

8. The method of claim 1, wherein the semiconductor layer comprises silicon carbide (SiC).

9. A method for fabricating a silicon carbide (SiC) device, the method comprising:

forming a carbon masking layer on a SiC layer;

forming a protective layer on the carbon masking layer;

forming an opening in the carbon masking layer and the protective layer using an isotropic, dry etching process;

implanting a plurality of p-type ions in the SiC layer through the opening to form a p+ implant region in the SiC layer;

enlarging the opening in the carbon masking layer using an isotropic, dry etching process;

implanting a plurality of n-type ions in the SiC layer through the enlarged opening to form a n+ ion implant region in the SiC layer;

performing an isotropic, dry etching process to further enlarge the opening in the carbon masking layer;

implanting a plurality of p-type ions in the SiC layer through the further enlarged opening to form a p-type well in the SiC layer;

removing the protective layer;

forming a carbon capping layer on the SiC layer in the enlarged opening;

annealing the SiC structure;

etching the carbon capping layer, wherein the etching leaves a spacer extending over a channel formed in the p-type well;

depositing a field oxide layer on the semiconductor structure;

planarizing the field oxide layer;

removing the carbon masking layer and the spacer; and forming a gate dielectric layer on the semiconductor structure.

10. The method of claim 9, wherein the SiC structure is annealed at a temperature of at least about 1600 degrees Celsius.

* * * * *